United States Patent [19]
McBride

[11] Patent Number: 5,471,640
[45] Date of Patent: Nov. 28, 1995

[54] PROGRAMMABLE DISK ARRAY CONTROLLER HAVING N COUNTERS FOR N DISK DRIVES FOR STRIPPING DATA WHERE EACH COUNTER ADDRESSES SPECIFIC MEMORY LOCATION BY A COUNT N

[75] Inventor: John G. McBride, Boise, Id.

[73] Assignee: Hewlett-Packard, Palo Alto, Calif.

[21] Appl. No.: 909,902

[22] Filed: Jul. 6, 1992

[51] Int. Cl.$^6$ ........................................... H01J 3/00
[52] U.S. Cl. .................. 395/842; 364/239.4; 364/238.3; 364/243.5; 364/DIG. 1
[58] Field of Search ..................................... 395/275, 425, 395/725, 842

[56] References Cited

U.S. PATENT DOCUMENTS

| | | | |
|---|---|---|---|
| 3,626,374 | 12/1971 | Ghinlund | 395/425 |
| 4,509,118 | 4/1985 | Shenk | 395/775 |
| 4,688,168 | 8/1987 | Gudaitis et al. | 395/325 |
| 5,208,813 | 5/1993 | Stallmo | 371/10.1 |

OTHER PUBLICATIONS

Patterson et al, "A Case for Redundant Arrays of Inexpensive Disks RAID", Mar. 1988, 109–116.

Primary Examiner—Thomas C. Lee
Assistant Examiner—Sang Hui Kim

[57] ABSTRACT

A programmable disk array controller distributes contiguous data from a host processor across a plurality of disk drives. The controller includes a device port with a plurality of connected disk drives. A dual ported buffer memory receives data from the host processor for storage to the disk drives. The programmable controller accesses data from the buffer memory and causes it to be fed to the device port for storage in the disk drives. The programmable controller includes a variable increment counter associated with each disk drive for controlling the data address accessed from the buffer memory. Each variable increment counter is programmable to sequentially increment a count by a value n so that its associated disk drive receives every nth data segment from the buffer memory.

13 Claims, 1 Drawing Sheet

PROGRAMMABLE DISK ARRAY CONTROLLER HAVING N COUNTERS FOR N DISK DRIVES FOR STRIPPING DATA WHERE EACH COUNTER ADDRESSES SPECIFIC MEMORY LOCATION BY A COUNT N

FIELD OF THE INVENTION

This invention relates to a controller for an array of inexpensive disk drives, and more particularly, to a disk drive controller that controls a multiplicity of redundant, inexpensive disk drives and employs a minimal number of disk drive port circuits.

BACKGROUND OF THE INVENTION

Patterson et al., in "A Case for Redundant Arrays of Inexpensive Disks (RAID)", ACM Sigmod Conference, Chicago, Ill., Jun. 1–3, 1988 pages 109–116, indicate that the capacity of single, large, expensive magnetic disk drives has grown rapidly, but their performance improvements have been modest. They suggest that redundant arrays of inexpensive disks (RAID) offer an attractive alternative to the large expensive disks, and promise performance improvements of an order of magnitude. The drawback of disk drive arrays is that the mean time to failure of any single disk drive in an array is such as to render the array subject to failure at intervals unacceptable to today's user. In fact, they conclude that without fault tolerance, large arrays of inexpensive disks are so unreliable as to be useless.

As a solution to the reliability problem, Patterson et al., postulate five levels of RAID system redundancies that either partially or largely overcome the reliability problem. Each of the five proposed systems enables a failed disk drive to be rapidly replaced and the data that it contained, reproduced on the replacement disk drive. In addition, the data on the failed drive is made available to the host processor, even before it is written to the replacement disk drive.

In the ensuing description of various levels of RAID systems, the concept of "striping" will be referred to. In essence, striping refers to the interleaving of data across a plurality of disks. The interleaving may be by bit, byte, word, or block, with succeeding data elements placed upon succeeding disk drives in a "stripe" arrangement. For example, assuming a four disk drive array, word one would be placed upon disk drive one, word two on disk drive two, words three and four on disk drives three and four, word five on disk drive one, etc. In the case of RAID systems that employ parity redundancy, an extra disk drive (or drives) contain parity information for each respective stripe. The loss of a disk drive does not hinder the replacement of its data as it can be recovered using the parity data.

Patterson et al. postulated the following levels of RAID:

first level RAID: mirrored disks—this system structure is the traditional approach wherein all disk drives are duplicated and every write to a disk is also written to a check disk.

second level RAID: this arrangement contemplates bit-interleaving the data across the disks of a group of disk drives and then adding enough check disks to detect and correct a single bit error on any disk.

third level RAID: data is striped across a plurality of disks and a redundant parity disk drive is provided. Information on a failed disk can be reconstructed by calculating the parity of the remaining good disks and then comparing, bit by bit, to the parity calculated for the original full group of disk drives. Third level RAID brings the reliability overhead cost to its lowest level and provides excellent performance characteristics. Another aspect of RAID levels two and three is that all disks with data are involved in each data transfer.

fourth level RAID: This system arrangement suggests keeping larger individual data units (e.g., blocks of data) on a single disk, writing sequential blocks across a plurality of disks, calculating parity for the blocks and placing the parity block on an additional parity disk drive. Raid level four enables a certain level of parallelism to be achieved in the reading actions on the various disks.

fifth level RAID: No single disk drive is assigned as the repository for check or parity characters in this system configuration. Parity is distributed amongst all of the disks in the array. Thus, assuming a five disk array, the first stripe starts on disk one and the parity for stripe one is placed on disk five. The parity for stripe two is placed on disk one, and its first data segment commences on disk two, etc. This level also enables parallel reading and writing to the disks.

Subsequent to the Patterson et al. paper, a RAID zero level has been postulated wherein data is striped across a plurality of disk drives, with no provision for insertion of parity. Of the described RAID levels, levels zero, one, three and five have become the most widely used. However, prior art array controller structures, because of the complex data arrangements required by RAID three and five, have exhibited substantial inflexibility in regards to any change in arrangement of connected disk drives. Furthermore, array controllers for such RAID arrangements have generally exhibited one device port per disk drive, increasing the cost of such controllers.

Prior art array controllers operate in both a buffered and non-buffered mode. The ADP-92 disk array controller marketed by the NCR Corporation, Dayton, Ohio does not buffer data between a host processor and disk drive array. The controller distributes incoming data to each of the drives as the data is received from the host. The ADP-92 includes a device port controller module for each disk drive that adds expense to the controllers structure.

Other array controllers employ a single-ported buffer that temporarily stores data being transferred between disks and a host computer. The advantage of the buffer is that the host port is able to transfer data at its maximum rate in block-striped modes, whereas a controller without a buffer cannot. Likewise, the buffer enables the controller to take advantage of overlaps and latencies of devices in the host channel. Such controllers are, by their nature however, more expensive to implement and, further, single-ported buffers present a constraint on data transfers due to their single-port structure.

Accordingly, it is an object of this invention to provide an controller for an array of disk drives which has programmable flexibility to handle variable numbers of disk drives.

It is another object of this invention to provide a programmable array controller that is capable of implementing various RAID level arrangements, while maintaining a minimal number of device ports.

It is yet another object of this invention to provide a buffered disk array controller that avoids the performance penalties that arise from the use of a single-port buffer.

SUMMARY OF THE INVENTION

A programmable disk array controller distributes contiguous data from a host processor across a plurality of disk drives. The controller includes a device port with a plurality of connected disk drives. A dual ported buffer memory receives data from the host processor for storage to the disk drives. The programmable controller accesses data from the buffer memory and causes it to be fed to the device port for storage in the disk drives. The programmable controller includes a variable increment counter associated with each disk drive for controlling the data addresses accessed from the buffer memory. Each variable increment counter is programmable to sequentially increment a count by a value n so that its associated disk drive receives every nth data segment from the buffer memory.

DESCRIPTION OF THE DRAWING

The FIG. 1 is a block diagram of an array controller that implements the invention hereof.

DETAILED DESCRIPTION OF THE INVENTION

Figure 1:
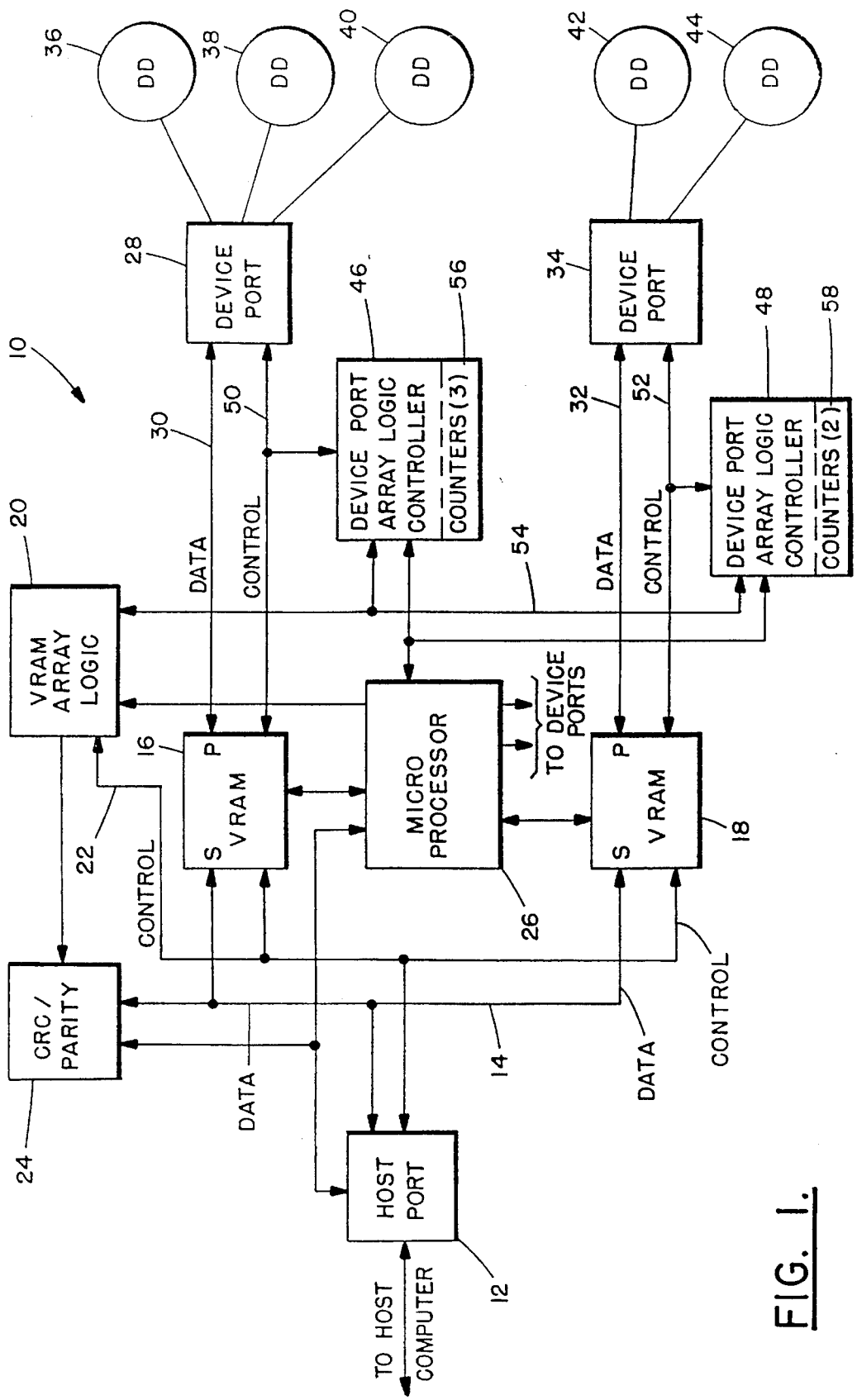

In FIG. 1, a host computer communicates with array controller 10 via a host port 12. Host port 12 feeds received host data, via data bus 14, to one or more buffer memories. In the example shown in the figure, two video random access memory (RAM) buffers 16 and 18 are shown, with data bus 14 being connected to their respective serial data input ports. A video RAM (VRAM) is a dual ported random access memory, with one port providing a serial data I/O capability and another port providing an independently operable parallel data I/O port. Data flow to video RAMS 16 and 18 is controlled by VRAM array logic module 20. A control bus 22 connects VRAM array logic module 20 to host port 12 and video RAMS 16 and 18.

Data emplaced on data bus 14 by host port 12 is also fed to a CRC/parity generating module 24, whereby cyclic redundancy check characters and other parity signals are derived. A microprocessor 26 is connected to each of the modules within controller 10 and controls the operation of the entire array controller.

Video RAM 16 has its parallel port connected to device port 28 via data bus 30. In similar fashion, video RAM 18 has its parallel port connected, by data bus 32, to device port 34. For exemplary purposes, three disk drives (i.e., 36, 38 and 40) are serviced by device port 28 whereas two (42 and 44) are serviced by device port 34. The operation of video RAMS 16 and 18 and device ports 28 and 34 are controlled by device port array logic controllers 46 and 48, respectively.

Device port array logic controller 46 is connected, via control bus 50, to video RAM 16 and device port 28. In similar fashion, device port array logic controller 48 is connected, via control bus 52, to video RAM 18 and device port 34. Each of device port array logic controllers 46 and 48 further receives inputs from video RAM array logic module 20 via control bus 54.

Each of device port array logic controller 46 and 48 contains a plurality of counters, one assigned to each disk drive serviced by an associated device port. Device port array logic controller 46 has three counters 56, and device port array logic controller 48 has two counters 58. Each counter is programmable and may be set to commence at any count and to increment by as many counts as desired.

Hereafter, it will be assumed that array controller 10 is operating in a RAID-three mode whereby sequential data words are distributed across disk drives 36, 38, 40 and 42, and parity words are stored in disk drive 44 (i.e., word striping). Thus, the first stripe comprises word 1 stored on disk drive 36, word 2 on disk drive 38, word 3 on disk drive 40, word 4 in disk drive 42 and the parity for words 1–4 stored on disk drive 44. The next stripe begins with word 5 which is stored on disk drive 36 and proceeds in a cyclic manner until all words are stored and the resulting parity for each stripe is stored on disk drive 44.

Prior to discussing the detailed operation of array controller 10, the function of video RAM array logic 20 and device port array logic controllers 46 and 48 will be considered. It will be assumed, hereafter, that data is distributed among disk drives 36, 38, 40, 42, and 44 on a by-word basis. As individual words are received by host port 12 and are placed on data bus 14, video RAM array logic 20 causes them to be stored sequentially into video RAMS 16 and 18. Words 1, 2, and 3 are stored contiguously in the first three storage positions in video RAM 16, and word 4 is stored in the first storage position in video RAM 18. After words 1–4 are distributed across video RAMs 16 and 18, a parity word, derived for words 1–4 by CRC/parity module 24, is inserted in the next contiguous data position in video RAM 18 (second storage position), and the sequence of storage of data words recommences in video ram 16, etc. By this action, video RAM array logic 20 readies incoming data words for storage in disk drives 36–44 in a RAID-three fashion.

Each device port array logic controller (46, 48) determines which word is accessed from its associated video RAM and fed to an associated device port for storage on a disk drive. Word selection is controlled by counters 56 and 58. Each of counters 56 and 58 is programmed to increment by a count equal to the number of disk drives connected its associated video RAM, i.e., 3 and 2, respectively, for the example shown in the figure. Each counter is also programmed to offset its count by an initial count of one. Thus, the first of counters 56 starts at a count of one; the second counter starts at a count of two and the third counter starts at count of three and each of counters 56 increments by values of three. In a similar fashion, the two counters 58 in device port array logic controller 48 commence their counts at counts one and two, respectively, and each counter increments its count by a value of two.

The programming of counters 56 and 58 is controlled by microprocessor 26 and is related to the number of disk drives connected to their associated video RAMs and the RAID procedure being implemented. In the example shown in the figure, the first of counters 56 increments from one to four to seven, etc. That counter is assigned to disk drive 36. Thus, it's count causes video RAM 16 to read out its first, fourth, seventh, etc. words onto data bus 30 and into device port 28 for storage in succeeding stripes in disk drive 36. Similarly, the second of counters 56 is assigned to disk drive 38 and causes the second, fifth, eighth, etc., words from video RAM 16 to be stored in disk drive 38 in succeeding stripes, etc.

The operation of the system will now be described assuming that a RAID-three procedure is implemented and that a write-to-disk has been requested. In response to a write-to-disk request from the host computer, host port 12 institutes an interrupt of microprocessor 26. Microprocessor 26, in response, provides host port 12 with permission to receive data and host port 12, in turn, instructs the host computer to transmit its data. Concurrently, microprocessor 26 also programs array logic controllers 20, 46, and 48 as to the placement of incoming data. Thus, microprocessor 26 instructs video RAM array logic 20 that there are five disk drives attached to array controller 10; that disk drives 36, 38, and 40 are connected to video RAM 16; and that disk drives 42 and 44 are connected to video RAM 18. Further, it instructs video RAM array logic 20 that a RAID-three procedure is to be carried out and that the incoming words are to be distributed to video RAMS 16 and 18 so as to allow data word striping across disk drives 36, 38, 40 and 42 and insertion of parity data onto disk drive 44. Microprocessor 26 also initializes CRC/parity module 24. Video RAM array logic 20 now instructs device port array logic controllers 46 and 48 to cause activation of the serial ports on video RAMs 16 and 18 so as to enable reception of data from host port 12.

When a first word is placed by host port 12 on data bus 14, the word is stored in video RAM 16 and, simultaneously, a parity value is calculated in CRC/parity module 24. Similar actions occur with the second and third words which are stored in adjacent positions in video RAM 16. When a fourth word appears on bus 14, video RAM array logic 20 causes it to be transmitted to video RAM 18 where it is stored. Since CRC/parity module 24 now contains parity for words 1–4, its value is placed in the next storage position within video RAM 18. When the fifth word arrives, it is directed to video RAM 16 by video RAM array logic 20 and the aforedescribed action continues until all data is stored in video RAMs 16 and 18.

It will be understood by those skilled in the art that data transfers out of video RAMS 16 and 18 may be commenced prior to the completion of the input storage activity, however, it is important that the data output not outrun the data input from host port 12. In this example, it Will be assumed that microprocessor 26 does not commence data storage into the disk drives until video RAMs 16 and 18 have been filled and no further data is being stored therein through their respective serial I/O ports. It is further to be understood that the starting addresses in either video RAM can be at any memory location and that the addresses in the two video-RAMs are independent of each other.

Microprocessor 26 now (or at an earlier time) programs counters 56 and counters 58 to commence at the proper incremented counts and to increment each count by the number of disk drives attached to their associated video RAMs. As above indicated, each counter is also associated with a disk drive and controls data access from its associated video RAM into the respectively associated disk drive. Microprocessor 26 thus initializes the first of counters 56 to commence at a count of one, the second counter to commence at a count of two and the third counter to commence at a count of three. Counters 58 are similarly initialized to start at counts of one and two respectively. Counters 56 are instructed to increment by a count of three and counters 58 by a count of two.

Microprocessor 26 further readies device ports 28 and 34 to receive data (as well as the disk drives connected thereto). Microprocessor 26 then provides a "go" signal to device port array logic controller 46, which in turn signals device port 28 that data transfers are ready. Device port 28 then requests a word for disk drive 36, and controller 46 accesses the first word in video RAM 16 and places it on data bus 30. The first counter 56 is then incremented by a count of three and the fourth data word in video RAM 16 is accessed and written to disk drive 36. Normally, all writes to a single disk drive are accomplished and then device port 28 is caused to switch to disk drive 38 wherein all writes are accomplished therein through the action of the second of counters 56. The procedure continues until all data has been written into disk drives 36–44 in accordance with the respective controlling counts in counters 56 and 58. In a similar fashion the CRC data words are written to disk in proper sequence.

The programmability of device port array logic controllers 46 and 48 and their respectively included counters enables any number of disk drives to be connected to a device port or a bank of video RAM buffer memories. Adjusting the count increment and initial count states, enables data to be written across the disk drives in a given RAID arrangement. The procedure is also applicable to RAIDs zero, one, four and five. In such cases microprocessor 26 continually updates the initial counts of the counters to assure that the data is properly distributed across the various disk drives of the array.

Let it be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A programmable disk array controller for distributing data from a host processor across a plurality of disk drives, said controller comprising:

device port means;

n disk drives connected to said device port means;

buffer memory means for receiving and storing data from said host processor and connected to said device port means;

programmable controller means for accessing a sequence of data segments from said buffer memory means, and for causing said sequence of data segments to be fed to said device port means for storage into a sequence of said n disk drives, said programmable controller means including a counter means associated with each disk drive, each said counter means programmable to sequentially increment by a count of n so that said buffer memory means distributes said sequence of data segments across said n disk-drives by providing every nth data segment to a disk drive associated with a said counter means.

2. The programmable disk array controller as recited in claim 1 wherein each said counter means associated with a disk drive in said sequence, is initialized to an initial count that is one greater than the initialization count of a counter means associated with a disk drive one earlier in said sequence.

3. The programmable disk array controller as recited in claim 2 wherein each said programmable counter means is programmed to increment by a count that is equal to a number of disk drives connected through said device port means to said buffer memory means.

4. The programmable disk array controller of claim 3 wherein said programmable controller means includes a microprocessor for controlling said programmable counter means.

5. The programmable disk array controller of claim 1 wherein said buffer memory means is a dual port memory, each said port having input/output capabilities, one said port coupled to said host processor and another said port coupled to said device port means.

6. The programmable disk array controller of claim 5 wherein a said buffer memory means is a video random access memory (RAM) having a serial data port and a parallel data port, said serial data port serving as an input/output interface for host computer data and said parallel data port serving as an input/output interface for disk drive data.

7. The programmable disk array controller as recited in claim 1 wherein said programmable controller means includes processor means for controlling counts and increment values of said counter means to enable a redundant array of independent disks (RAID)-three data format to be stored in said disk drives.

8. The programmable disk array controller as recited in claim 1 wherein said programmable controller means includes processor means for controlling counts and increment values of said counter means to enable RAID zero, one, four and five data formats to be stored in said disk drives.

9. A programmable disk array controller for distributing data from a host processor across a plurality of disk drives, said controller comprising:

a plurality of device port means;

a set of disk drives connected to each said device port means;

a plurality of buffer memory means, each for receiving and storing data segments from said host processor and connected to a said device port means;

a programmable controller means associated with each said buffer memory means, for accessing a sequence of data segments from a said associated buffer memory means, and for causing said sequence of data segments to be fed for storage across a sequence of said disk drives, each said programmable controller means including a counter means associated with each disk drive, each said counter means programmable to sequentially increment by a count equal to a number n of disk drives connected to an associated buffer memory means through said device port means, so that said buffer memory means provides every nth data segment of a said sequence to a disk drive associated with a said counter means.

10. The programmable disk array controller as recited in claim 9 wherein each said counter means associated with a disk drive in a sequence of disk drives is initialized to an initial count that is one greater than an initialization count of a counter means associated with a disk drive one earlier in said sequence.

11. The programmable disk array controller as recited in claim 10 wherein each said programmable counter means is programmed to increment by a count that is equal to a number of disk drives connected through said device port means to said buffer memory means.

12. The programmable disk array controller of claim 11 wherein each said buffer memory means is a video RAM having a serial data port and a parallel data port, said serial data port serving as an input/output interface for host computer data and said parallel data port serving as an input/output interface for disk drive data.

13. The programmable disk array controller as recited in claim 11 further comprising a video RAM array logic circuit for controlling distribution of host computer data as between said video RAMs.

* * * * *